United States Patent [19]
Kinomura

[11] Patent Number: 5,982,235
[45] Date of Patent: Nov. 9, 1999

[54] AUTOMATIC GAIN CONTROL CIRCUIT

[75] Inventor: Masahiro Kinomura, Yokohama, Japan

[73] Assignee: Matsushita Electric Industrial Co., Ltd., Osaka, Japan

[21] Appl. No.: 09/069,604

[22] Filed: Apr. 29, 1998

[30] Foreign Application Priority Data

Apr. 30, 1997 [JP] Japan .................................. 9-124750

[51] Int. Cl.$^6$ ...................................................... H03G 3/10
[52] U.S. Cl. .......................................... 330/279; 330/129
[58] Field of Search ...................................... 330/279, 129, 330/149; 455/226.3, 234.1, 232.1, 249.1, 504

[56] References Cited

U.S. PATENT DOCUMENTS

| | | | |
|---|---|---|---|
| 2,694,142 | 11/1954 | Laidig ........................................ | 250/20 |
| 3,147,438 | 9/1964 | Hedger et al. ........................... | 325/363 |
| 4,246,655 | 1/1981 | Parker ...................................... | 455/135 |
| 5,719,898 | 2/1998 | Davidovici .............................. | 375/200 |

FOREIGN PATENT DOCUMENTS

| | | |
|---|---|---|
| 4-37334 | 2/1992 | Japan . |
| 4-137933 | 5/1992 | Japan . |
| 4-299608 | 10/1992 | Japan . |

*Primary Examiner*—Robert Pascal
*Assistant Examiner*—Henry Choe
*Attorney, Agent, or Firm*—Pearne, Gordon, McCoy & Granger LLP

[57] ABSTRACT

An automatic gain control circuit of an amplifier 1 having a gain control function is provided with a signal-to-noise detection circuit 2 which detects a signal-to-noise ratio of an output signal and an AGC setting circuit 3 which sets the gain of the amplifier 1. The AGC setting circuit 3 determines the AGC gain according to the level of an input signal and the signal-to-noise ratio detected by the signal-to-noise ratio detection circuit 2. In a region where there is a large AGC gain and where the signal-to-noise ratio is reduced by the AGC circuit, the level of an output signal is increased so as to render the signal-to-noise ratio of the output signal constant. Even if an input electric field is reduced by a fading phenomenon and if there is an increase in the AGC gain, there is prevented a decrease in the signal-to-noise ratio due to an increase in the noise floor stemming from the AGC circuit itself, thereby preventing deterioration of the receiving sensitivity of the automatic gain control circuit.

4 Claims, 5 Drawing Sheets

AUTOMATIC GAIN CONTROL CIRCUIT

BACKGROUND OF THE INVENTION

1. Field of the Invention

The present invention relates to an automatic gain control circuit which amplifies an analog signal while automatically controlling the gain of the signal, and more particularly, to an automatic gain control circuit which is used for mobile communication and which constantly maintains a signal-to-noise ratio of an output signal (a ratio of an output signal to noise).

2. Description of the Related Art

An automatic gain control circuit such as that described in Japanese Patent Application Laid-open No. Hei-4-037334 is known as an existing automatic gain control circuit. FIG. 8 shows the configuration of the existing automatic gain control circuit. An input IF signal is amplified by an amplifier 1 having a gain control function, and the thus-amplified signal is output to a demodulation circuit from an output terminal of the amplifier. At this time, part of the output from the amplifier 1 is input to an AGC detection circuit 6, and an AGC setting circuit 3 sets for the amplifier 1 a gain corresponding to the level of the output signal detected by the AGC detection circuit 6. If the level of the output signal is high, the automatic gain control circuit is controlled so as to reduce the gain of the amplifier 1, rendering the level of the output signal constant.

However, the foregoing configuration of the existing automatic gain control circuit is capable of constantly maintaining the level of the signal output but is impossible to constantly maintain a ratio of an output signal to noise (i.e., a signal-to-noise ratio). Since there is an increase in an AGC gain and the noise floor of the automatic gain control circuit, the ratio of an output signal to noise (i.e., a signal-to-noise ratio) of the output signal is deteriorated, as a result of which a bit error rate (BER) of the output signal is also deteriorated.

In mobile communication, as compared with a mean level, a receiving level changes as great as +10 dB or more to −30 dB or less. For this reason, in a case where the existing automatic gain control circuit is applied to mobile communication, a conversion level of the automatic gain control circuit is determined, in consideration of variations in the receiving level both in positive and negative ranges due to a fading phenomenon. If there is a drop in the receiving level in excess of the range of control of the automatic gain control circuit, the output signal is decreased, thereby deteriorating the ratio of the output signal to noise (i.e., the signal-to-noise ratio). This in turn deteriorates the bit error rate (BER) of the output signal at the time of a strong electric field fading phenomenon.

SUMMARY OF THE INVENTION

The present invention has been conceived to solve drawbacks such as those mentioned previously, and the object of the present invention is to provide an automatic gain control circuit whose bit error rate can be improved in the event of a fading phenomenon by ensuring a sufficient ratio of an output signal to noise (i.e., a signal-to-noise ratio).

To accomplish the foregoing object, according to the present invention, an automatic gain control circuit has a signal-to-noise ratio detection circuit and an AGC setting circuit and controls the gain of the automatic gain control circuit so as to render a ratio of an output signal to noise (i.e., a signal-to-noise ratio) constant with respect to variations in the input level of the automatic gain control circuit.

The automatic gain control circuit is further provided with an attenuation setting circuit which achieves a constant ratio of an output signal to noise (i.e., a constant signal-to-noise ratio) and a constant output level.

The automatic gain control circuit is further provided with a fading detection circuit and an AGC conversion level setting circuit. A drop in the level of the output signal due to a fading phenomenon is improved by changing the AGC convergence level according to variations in the level of the input signal.

With the foregoing configurations, a sufficient ratio of an output signal to noise (i.e., a sufficient signal-to-noise ratio) can be ensured in the event of a fading phenomenon, and hence the bit error rate of the automatic gain control can also be improved.

Particularly, according to a first aspect of the invention, there is provided an automatic gain control circuit equipped with an amplifier having a gain control function, the circuit comprising:

a signal-to-noise ratio detection circuit which detects a signal-to-noise ratio (or a ratio of an output signal to noise) of a signal output from the amplifier; and an AGC setting circuit which determines an AGC gain so as to constantly maintain the signal-to-noise ratio according to the level of a signal input to the amplifier and the signal-to-noise ratio. The automatic gain control circuit prevents deterioration of the signal-to-noise ratio, which would otherwise be cause by an increase in the noise floor stemming from the automatic gain control circuit itself.

According to a second aspect of the invention, the automatic gain control circuit according to the first aspect is further characterized by comprising:

an attenuation setting circuit which sets the amount of attenuation of the output signal so as to maintain the signal-to-noise ratio and the level of the output signal to a constant level according to the level of an input signal. As a result, even in the case of a decrease in the level of an input electric field, a stable bit error rate is maintained.

According to a third aspect of the invention, the automatic gain control circuit according to the first aspect is further characterized by comprising:

a fading detection circuit which detects variations in the level of the input signal; and an AGC convergence level setting circuit which changes the level of an AGC output (i.e., the level of AGC convergence) according to variations in the level of the input signal. As a result, the automatic gain control circuit prevents deterioration of receiving sensitivity of the automatic gain control circuit, which would otherwise be caused by a reduction in the receiving level of the automatic gain control circuit at the time of a fading phenomenon.

According to a fourth aspect of the invention, the automatic gain control circuit according to the first aspect is further characterized by comprising:

an attenuation setting circuit which sets the amount of attenuation of the output signal so as to maintain the signal-to-noise ratio and the level of the output signal to a constant level according to the level of an input signal;

a fading detection circuit which detects variations in the level of the input signal; and an AGC convergence level setting circuit which changes the level of an AGC output (i.e., the level of AGC convergence) according to variations in the level of the input signal. As a result, the automatic gain control circuit prevents deterioration of the receiving sensitivity of the automatic gain control circuit even in the event of a reduction in the level of an input electric field or constant variations in the field intensity of a radio wave.

DETAILED DESCRIPTION OF THE PREFERRED EMBODIMENTS

Embodiments of the present invention will be described by reference to FIGS. 1 through 7.

(First Embodiment)

A first embodiment of the present invention is directed to an automatic gain control circuit provided with an AGC setting circuit which determines an AGC gain so as to maintain a signal-to-noise ratio at a constant value according to the level of an input signal and the signal-to-noise ratio.

Figure 1:
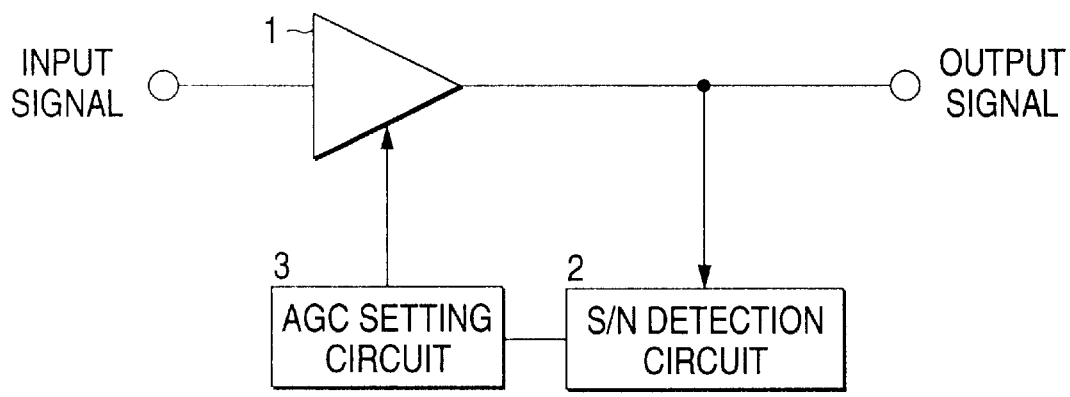
FIG. 1 is a block diagram showing an automatic gain control circuit according to a first embodiment of the present invention.
Figure 2:
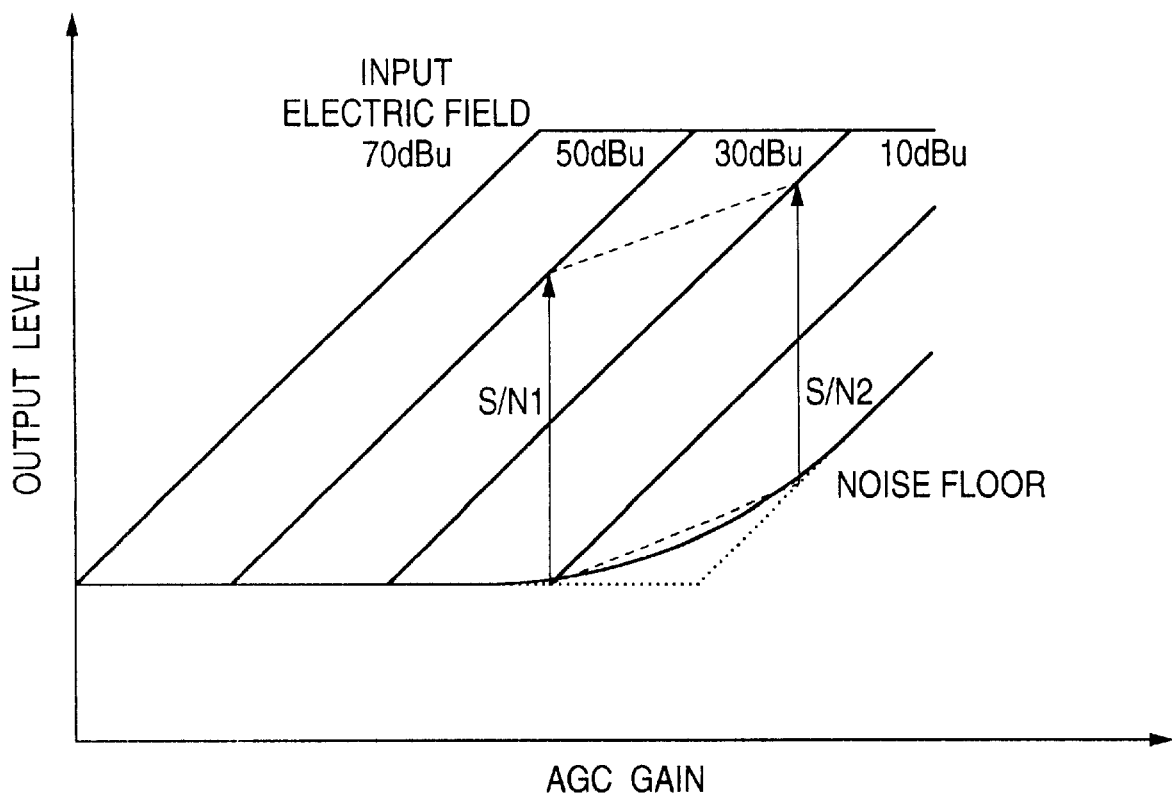
FIG. 2 is a plot showing a ratio of an output signal to noise (i.e., a signal-to-noise ratio) for the purpose of explaining an AGC operation of the automatic gain control circuit according to the first embodiment.
Figure 9:
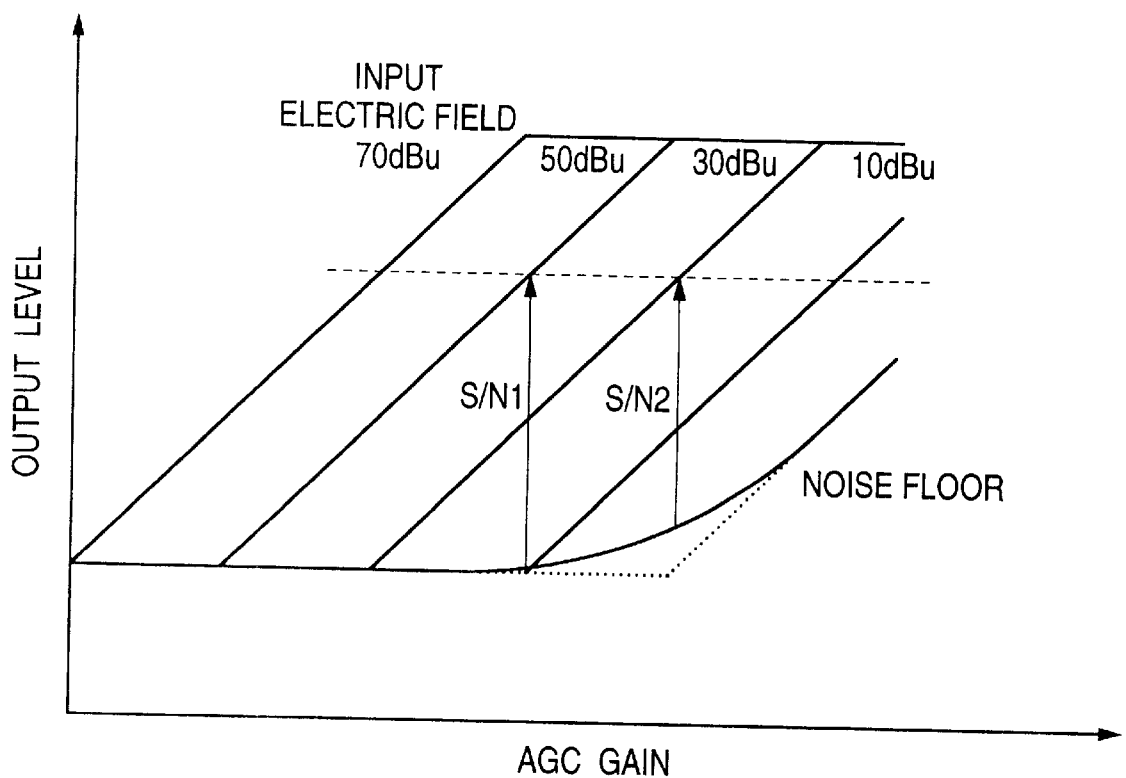
FIG. 9 is a plot showing a ratio of an output signal to noise (i.e., a signal-to-noise ratio) for the purpose of explaining an AGC operation of the existing automatic gain control circuit.

FIG. 1 is a block diagram showing an automatic gain control circuit according to the first embodiment of the present invention. In FIG. 1, a signal-to-noise ratio detection circuit 2 and an AGC setting circuit 3 are provided for the purpose of controlling the gain of an amplifier 1 having a gain control function. According to a ratio of an output signal to noise (i.e., a signal-to-noise ratio) detected by the signal-to-noise ratio detection circuit 2, the AGC setting circuit 3 determines the AGC gain such that the ratio of an output signal to noise (i.e., a signal-to-noise ratio) is maintained at a constant level. The automatic gain control circuit having the foregoing configuration prevents deterioration of the ratio of an output signal to noise (i.e., the signal-to-noise ratio) caused by an increase in the noise floor of the AGC circuit itself. The characteristics of the automatic gain control circuit according to the first embodiment of the present invention (see FIG. 2) and the characteristics of the existing automatic gain control circuit (see FIG. 9) are shown in a comparative manner.

With regard to the characteristics of the existing automatic gain control circuit (shown in FIG. 9), the AGC gain is controlled such that the amplitude of the output signal becomes constant with respect to variations in an input electric field. For example, if it becomes difficult for a radio wave to arrive at the automatic gain control circuit when the circuit is in a building's shadow and if the level of the input electric field drops to 30 dBu from 50 dBu, the AGC gain is increased by 20 dB so that the automatic gain control circuit can operate so as to maintain the output level at the level which is the same as that is obtained when the input electric field level is 50 dBu. However, even if the signal output level is the same, the noise floor level of the AGC circuit is also increased together with an increase in the AGC gain, and hence there cannot be obtained a ratio of an output signal to noise (i.e., a signal-to-noise ratio) which is the same as that is obtained when the input electric field level is 50 dBu. Hence, an error bit rate of the automatic gain control circuit is deteriorated.

With regard to the characteristics of the automatic gain control circuit according to the first embodiment (shown in FIG. 2), if there is a decrease in the level of the input electric field, e.g., from 50 dBu to 30 dBu, the AGC gain is set so as to obtain a ratio of an output signal to noise (i.e., the signal-to-noise ratio) which is the same as that is obtained when the level of the input electric field is 50 dBu.

As mentioned previously, the automatic gain control circuit according to the first embodiment is controlled so as to achieve a constant ratio of an output signal to noise (i.e., a signal-to-noise ratio) without reference to the level of the input electric field, which makes it possible to prevent the deterioration of the bit error rate of the automatic gain control circuit and to obtain constant sensitivity.

(Second Embodiment)

A second embodiment of the present invention is directed to an automatic gain control circuit equipped with an attenuation setting circuit which sets the amount of attenuation of the output signal so as to constantly maintain a signal-to-noise ratio and the level of the output signal according to the level of the input signal.

Figure 3:
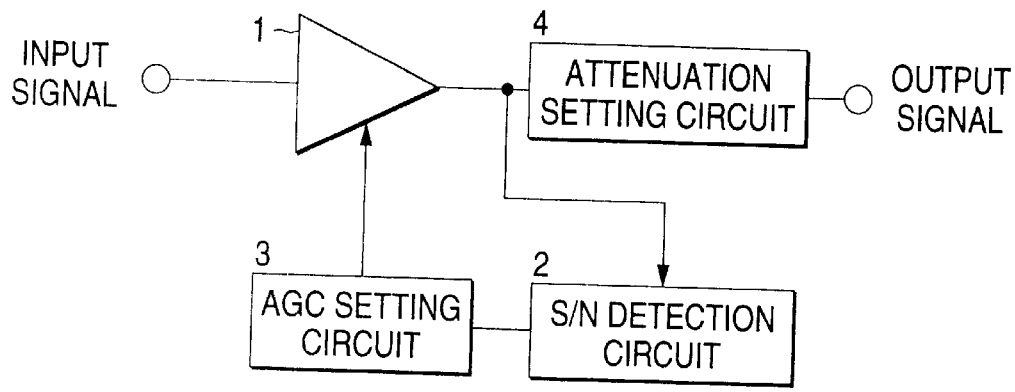
FIG. 3 is a block diagram showing an automatic gain control circuit according to a second embodiment of the present invention.

FIG. 3 is a block diagram showing an automatic gain control circuit according to a second embodiment of the present invention. Explanations of functions which are the same as those of the automatic gain control circuit according to the first embodiment will be omitted. In the case of the automatic gain control circuit having solely the same function as that of the automatic gain control circuit according to the first embodiment, the level of the output signal does not become constant even when the signal-to-noise ratio is the same. In a case where the receiver is required to perform a linear operation, the output signal becomes distorted. To prevent distortion of the output signal, the attenuation setting circuit 4 attenuates an increase in the signal output level, which would otherwise be caused in the range of the AGC gain where the noise floor is increased, thereby rendering the signal output level constant.

Figure 4:
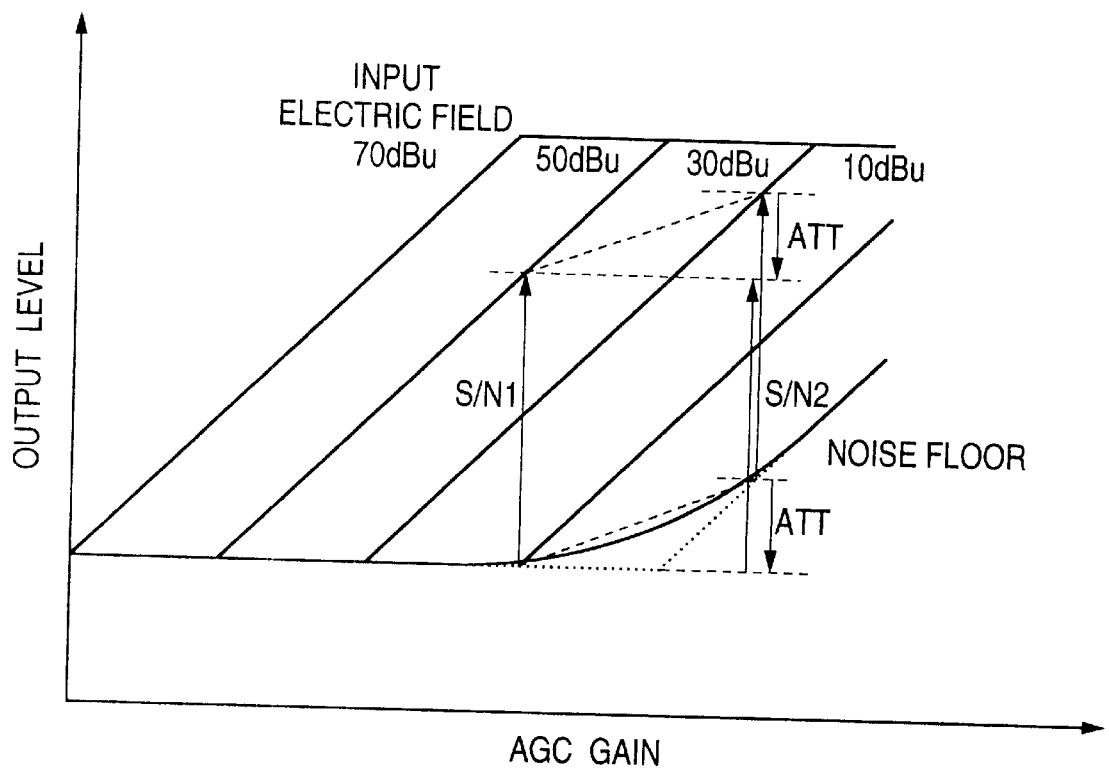
FIG. 4 is a plot showing a ratio of an output signal to noise (i.e., a signal-to-noise ratio) for the purpose of explaining an AGC operation of the automatic gain control circuit according to the second embodiment.

FIG. 4 shows the characteristics of the automatic gain control according to the second embodiment. When there is a decrease in the level of the input electric field from 50 dBu to 30 dBu, the AGC gain is set so as to achieve a ratio of an output signal to noise (i.e., a signal-to-noise ratio ) which is the same as that is obtained when the input electric field level is 50 dBu. However, since there is an increase in the noise level of the AGC circuit, the same output level is not obtained. For this reason, the attenuation setting circuit 4 attenuates the level of the output signal and noise, and the ratio of an output signal to noise (i.e., the signal-to-noise ratio) and the level of the signal output can be made constant without reference to the level of the input electric field.

As mentioned previously, the automatic gain control circuit according to the second embodiment of the present invention is controlled so as to provide a constant ratio of an output signal to noise (a signal-to-noise ratio) and a constant level of the signal output without reference to the level of the input electric field. As a result, the deterioration of the bit error rate of the automatic gain control circuit can be prevented, and constant sensitivity can be achieved.

(Third Embodiment)

A third embodiment of the present invention is directed to an automatic gain control circuit comprising a fading detection circuit which detects variations in the level of an input signal and an AGC convergence level setting circuit which changes the level of the AGC output according to variations in the level of the input signal.

Figure 5:
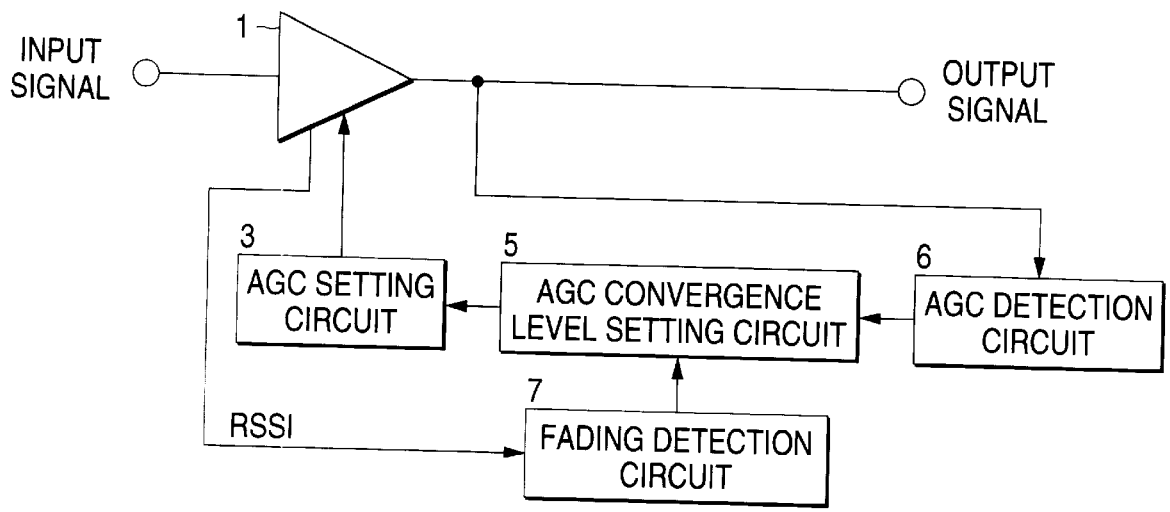
FIG. 5 is a block diagram showing an automatic gain control circuit according to a third embodiment of the present invention.
Figure 6:
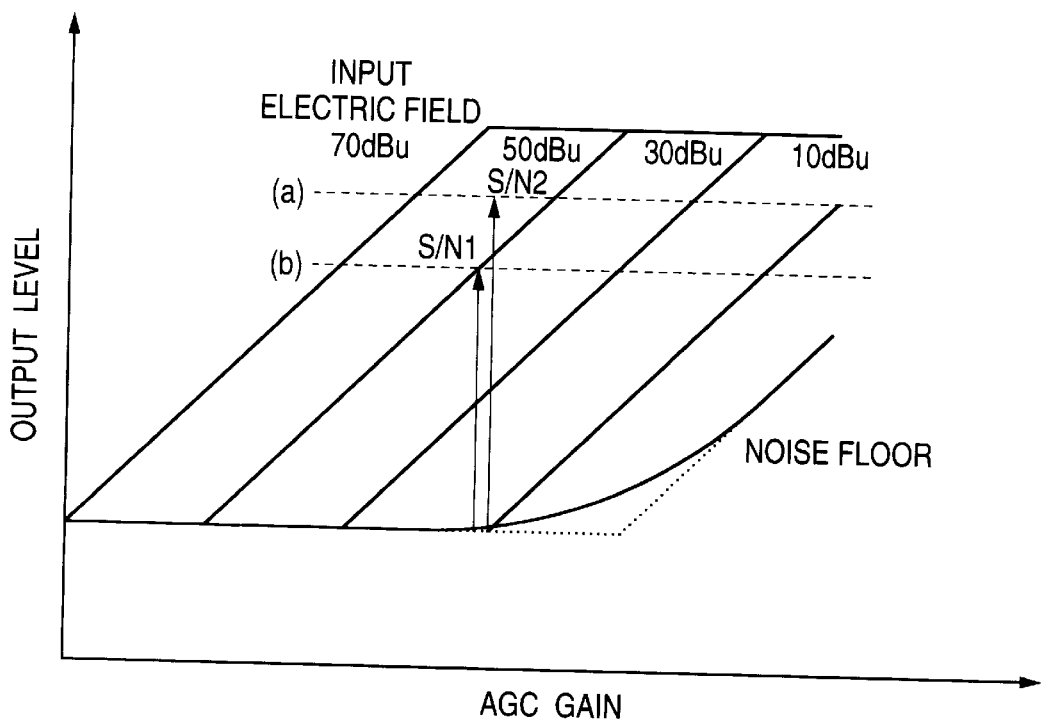
FIG. 6 is a plot showing a ratio of an output signal to noise (i.e., a signal-to-noise ratio) for the purpose of explaining an AGC operation of the automatic gain control circuit according to the third embodiment.

The characteristics of the automatic gain control according to the third embodiment of the present invention and the characteristics of the existing automatic gain control will be described by reference to FIGS. 5 and 6. According to the existing automatic gain control technique, if variations of −40 dB or more arise in the level of the input signal with regard to the convergence value designated by "b" shown in FIG. 6, data will be lost. To prevent the loss of data, the fading detection circuit 7 differentiates an RSSI (Receiving Field Strength) signal to thereby detect an inclination of the signal and determine whether or not there is a fading phenomenon. If it is determined that the automatic gain control circuit is on the move at high speed, the AGC convergence level setting circuit 5 controls the level of the AGC convergence level so as to increase from the level "b" to the level "a" shown in FIG. 6, in consideration of the level of the input signal detected by the AGC detection circuit 6, thereby preventing the loss of data. The differentiation of the fading detection circuit can be effected through use of an operational amplifier.

As mentioned previously, when a fading phenomenon causes a drop in the receiving level to such an extent as to exceed the range of AGC, the automatic gain control circuit according to the third embodiment increases the level of AGC convergence, thereby preventing deterioration of the ratio of an output signal to noise (i.e., the signal-to-noise ratio) and resulting in an improvement in the error bit rate of the automatic gain control circuit.

Although the explanation has described the embodiment in which a fading phenomenon causes a drop in the input level, an advantageous result-which is the same as that is obtained in the case where the input level is decreased-can be obtained by decreasing the level of AGC convergence even in a case where the waveform of an input signal becomes distorted as a result of an increase in the input level.

(Fourth Embodiment)

A fourth embodiment of the present invention is directed to an automatic gain control circuit comprising: an attenuation setting circuit which sets the amount of attenuation of the output signal so as to constantly maintain a signal-to-noise ratio and the level of the output signal according to the level of the input signal; and an AGC convergence level setting circuit which changes the level of the AGC output according to variations in the level of the input signal stemming from a fading phenomenon.

Figure 7:
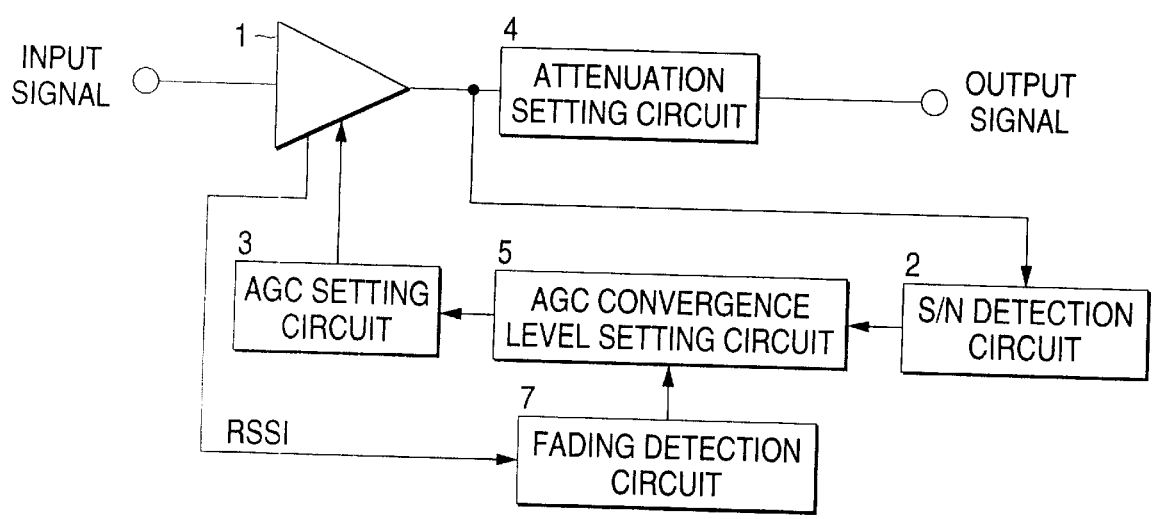
FIG. 7 is a block diagram showing an automatic gain control circuit according to a fourth embodiment of the present invention.
Figure 8:
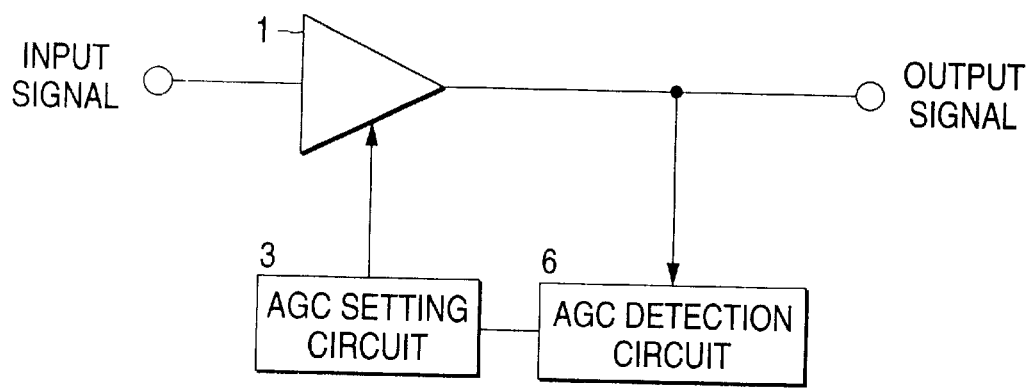
FIG. 8 is a block diagram showing an existing automatic gain control circuit.

The operation of the automatic gain control circuit according to the fourth embodiment will be described by reference to FIG. 7. The fading detection circuit 7 determines whether or not the automatic gain control circuit is on the move at high speed. If it is determined that the circuit is on the move at high speed, the AGC convergence level setting circuit 5 controls the AGC convergence level so as to increase or decrease, thereby preventing the loss of data. In contrast, if it is determined that the automatic gain control circuit is not on the move at high speed, the ratio of an output signal to noise and the output signal level are maintained at constant levels, thereby constantly maintaining the output level.

As mentioned previously, when a fading phenomenon causes a drop in the receiving level to such an extent as to exceed the range of AGC, the automatic gain control circuit according to the fourth embodiment increases the level of AGC convergence, thereby preventing deterioration of the ratio of an output signal to noise (i.e., the signal-to-noise ratio). If the automatic gain control circuit is not on the move at high speed, the circuit is controlled so as to constantly maintain the signal-to-noise ratio and the level of the output signal, whereby the constant error bit rate of the automatic gain control circuit can be obtained.

As has been described above, according to the present invention, the AGC gain is controlled so as to maintain a constant ratio of an output signal to noise (i.e., a constant signal-to-noise ratio). Therefore, even when the state of a radio wave is deteriorated when an automatic gain control circuit is in a building's shadow or even when the field intensity of the radio wave is constantly changed for reasons of a fading phenomenon stemming from high-speed movement of the automatic gain control circuit, a sufficient ratio of an output signal to noise (i.e., a sufficient signal-to-noise ratio) is ensured. Therefore, the bit error rate of the automatic gain control circuit can be improved, and the receiving sensitivity of the automatic gain control circuit can be prevented from being deteriorated.

What is claimed is:

1. An automatic gain control circuit, the circuit comprising:

an amplifier having a gain control function;

a signal-to-noise ratio detection circuit which detects a signal-to-noise ratio (or a ratio of an output signal to noise) of a signal output from the amplifier; and an AGC setting circuit which determines an AGC gain so as to constantly maintain the signal-to-noise ratio according to the level of a signal input to the amplifier and the signal-to-noise ratio.

2. An automatic gain control circuit equipped with an amplifier having a gain control function, the circuit comprising:

a signal-to-noise ratio detection circuit which detects a signal-to-noise ratio (or a ratio of an output signal to noise) of a signal output from the amplifier;

an AGC setting circuit which determines an AGC gain so as to constantly maintain the signal-to-noise ratio according to the level of a signal input to the amplifier and the signal-to-noise ratio; and, an attenuation setting circuit which sets the amount of attenuation of the output signal so as to maintain the signal-to-noise ratio and the level of the output signal to a constant level according to the level of an input signal.

3. An automatic gain control circuit equipped with an amplifier having a gain control function, the circuit comprising:

a signal-to-noise ratio detection circuit which detects a signal-to-noise ratio (or a ratio of an output signal to noise) of a signal output from the amplifier;

an AGC setting circuit which determines an AGC gain so as to constantly maintain the signal-to-noise ratio according to the level of a signal input to the amplifier and the signal-to-noise ratio;

a fading detection circuit which detects variations in the level of the input signal; and an AGC convergence level setting circuit which changes the level of an AGC output (i.e., the level of AGC convergence) according to variations in the level of the input signal.

4. The automatic gain control circuit as defined in claim 2, further comprising:

a fading detection circuit which detects variations in the level of the input signal; and an AGC convergence level setting circuit which changes the level of an AGC output (i.e., the level of AGC convergence) according to variations in the level of the input signal.

* * * * *